United States Patent [19]

Cuomo et al.

[11] Patent Number: 4,958,121
[45] Date of Patent: Sep. 18, 1990

[54] PROTECTION OF POWER CONVERTERS FROM VOLTAGE SPIKES

[75] Inventors: Andrea Cuomo; Claudio Diazzi, both of Milano, Italy; Klaus Rischmuller, Aix en Provence, France

[73] Assignee: SGS-Thomson Microelectronics s.r.l., Brianza, Italy

[21] Appl. No.: 444,553

[22] Filed: Nov. 30, 1989

[30] Foreign Application Priority Data

Nov. 30, 1988 [IT] Italy ............................... 83685 A/88

[51] Int. Cl.$^5$ ............................................ H02M 3/158
[52] U.S. Cl. ..................................... 323/224; 323/271; 323/284; 323/299; 361/18; 361/111
[58] Field of Search ............... 323/222, 224, 225, 268, 323/271, 284, 299; 361/18, 111

[56] References Cited

U.S. PATENT DOCUMENTS 4,887,021 12/1989 Walker ................................ 361/111

FOREIGN PATENT DOCUMENTS 157668  6/1988  Japan .
274363 11/1988  Japan .
1379780 3/1988  U.S.S.R. .

OTHER PUBLICATIONS

Robinson, "Transistor-Overvoltage Protection", Electronic Design, Feb. 19, 1958.

Primary Examiner—William H. Beha, Jr.
Attorney, Agent, or Firm—Bierman and Muserlian

[57] ABSTRACT

In a power converter circuit directly or indirectly connected to the power distribution network, the protection from voltage spikes which may occur on the power supply rail is implemented in a manner as to consent the utilization of at least a portion of the energy associated with the spike by storing portion of said energy in the reactive components of the converter circuit itself instead of dissipating completely the energy through a dissipating elements as in prior art arrangements. The novel circuit arrangement utilizes one or two spike sensors the output signal or signals of which are fed to logic gates which determine a certain configuration of the analog switches of the converter circuit. A protection voltage limiting element (zener diode, avalanche diode, voltage-dependent resistor, etc.) is functionally connected across the analog switch connected between the reactive element of the converter circuit and the power supply rail and limits to its intrinsic breakdown voltage the maximum voltage across the switch.

7 Claims, 2 Drawing Sheets

PROTECTION OF POWER CONVERTERS FROM VOLTAGE SPIKES

BACKGROUND OF THE INVENTION

1. Field of the Invention

The present invention relates to power conversion circuits operating in a switching mode and more particularly to circuit arrangements for the protection of semiconductor components from voltage spikes which may occur on the power supply rail.

2. Description of the Prior Art

A recurrent problem in power circuits operating in a switching mode and directly or indirectly connected through a rectifier and a low-pass filter to the power distribution network is the protection of the circuits from transient voltage peaks or "spikes" which may occur on the power supply network.

According to a widely used technique, protection elements, having a Zener-type electrical characteristic and capable of absorbing the energy of a spike thus limiting the maximum voltage "seen" by the. circuit to be protected, are employed. These protection elements may be voltage-dependent resistors, avalanche diodes, Zener diodes or special integrated structures having a similar behaviour, such as for example the so-called TRANSIL structure (TRANSIL is a trade name employed by the Thomson Company), as it is well known to a skilled technician.

A typical example of a circuit which is so directly connected to the power supply network is the so-called FLYBACK converter, the circuit diagram of which is depicted in FIG. 1. The two transistors M1 and M2, functionally representing two analog switches, during a normal operation of the circuit are driven "in-phase", alternately ON and OFF, at a certain frequency and with a certain "duty-cycle". The two driving signals, respectively Ph1 and Ph2, which in the case of the circuit shown are essentially coincident signals (Ph1=Ph2), may be generated by a Pulse Width Modulation (PWM) control circuit, in accordance with a technique familiar to the skilled technician, which utilizes a feedback network which, in the case of the converter depicted in FIG. 1, includes comparator means for comparing a signal replica of the output voltage Vo of the circuit with a preset reference voltage in order to generate an error signal for the PWM control loop. The "duty-cycle" of the two driving signals determines the controlled output voltage Vo.

During normal operating conditions, the transistor M1 is subjected to a maximum voltage about equal to the rectified supply voltage Vin during OFF periods, while the transistor M2 is subjected to a maximum voltage about equal to the output voltage Vo. Similarly the recirculation diode D1 is subjected to a reverse voltage about equal to Vin while the output diode D2 is subjected to a reverse voltage about equal to Vo. When a spike presents itself on the input supply rail (Vin+spike), the following conditions may occur:

(a) with both transistors M1 and M2 conducting, the diode D1 is subjected to the entire spike voltage and the energy contained in the spike causes a remarkable increase of the current through the inductance L, which is connected to ground through the transistor M2 and to the input rail through the transistor M1. In this case the current is limited only by the impedance of the inductor L subjected to the entire voltage, and it should be remembered that in many instances the impedance of the inductor L may become extremely low because of a possible saturation of the core;

(b) with both transistors M1 and M2 nonconducting, the transistor M1 is subjected to the entire spike voltage while the transistor M2 remains subjected to a normal operating voltage about equal to the value of the output voltage Vo.

As shown in FIG. 1, the conventionally adopted solution for reducing the voltage and the energy "seen" by the circuit in case of spikes on the supply network employes a voltage limiting element capable of withstanding the dissipation of the spike's energy, represented in FIG. 1 by a Zener diode Zs, connected across the input terminals of the converter. The energy dissipating element Zs, which may also be something else than a Zener diode, such as an avalanche diode, a voltage-dependent resistor, a TRANSIL or in any case an integrated structure having a voltage/current characteristic showing a definite breakdown voltage, as said before, limits the maximum voltage seen by the circuit to be protected to about the value of the intrinsic breakdown voltage of the element (Zs). This known solution has the drawback of requiring the use of a voltage limiting element capable of withstanding in practice the dissipation of the entire energy associated with the spike.

OBJECTIVE AND SUMMARY OF THE INVENTION

The circuit arrangement of the present invention for protecting a converter circuit from voltage spikes which may occur on the supply network to which the converter is directly or indirectly connected does not require the use of a voltage limiting element capable of dissipating the entire energy associated with the spikes. More advantageously the circuital means of the present invention ensure protection by exploiting the same reactive components of the converter circuit to be protected (L or L+C) for entirely or at least partially storing the energy associated with a spike, which energy can then be made available to the load of the converter circuit without dissipating it completely on a voltage-limiting, dissipating element, as in the case of the prior art arrangements.

Therefore, in accordance with the present invention, in a power converter circuit operating in a switching mode and comprising an inductance, a first analog switch connected substantially in series with said inductance between a terminal of the latter and a power supply rail and a second analog switch connected between the other terminal of the inductance and a common potential node of the converter circuit, and wherein said analog switches are driven respectively by a first and a second, customarily coincident, driving signals generated by a Pulse With Modulation (PWM) control circuit, the circuit arrangement for protecting the converter circuit from spikes which may occur on the power supply network includes:

a voltage limiting element functionally connected in parallel with said first analog switch;

at least a spike sensor capable of generating a logic signal in presence of a voltage spike on the supply network;

logic driving means of said first and second analog switches capable of opening said first analog switch and closing said second analog switch when said spike sensor generates said logic signal.

According to another embodiment of the invention, a second spike sensor is utilized for generating a second logic signal when the voltage across said second analog switch becomes greater than a preset maximum value and said driving logic means determine, when a spike is detected, also the opening of said second analog switch until the voltage across the second switch becomes greater than said preset maximum voltage and the subsequent closing of the second switch when said second spike sensor generates said second logic signal.

BRIEF DESCRIPTION OF THE DRAWINGS

The different aspects and advantages of the invention will become evident through the following detailed description of preferred embodiments, depicted in the accompanying drawings, wherein.

DESCRIPTION OF PREFERRED EMBODIMENTS

Figure 2:
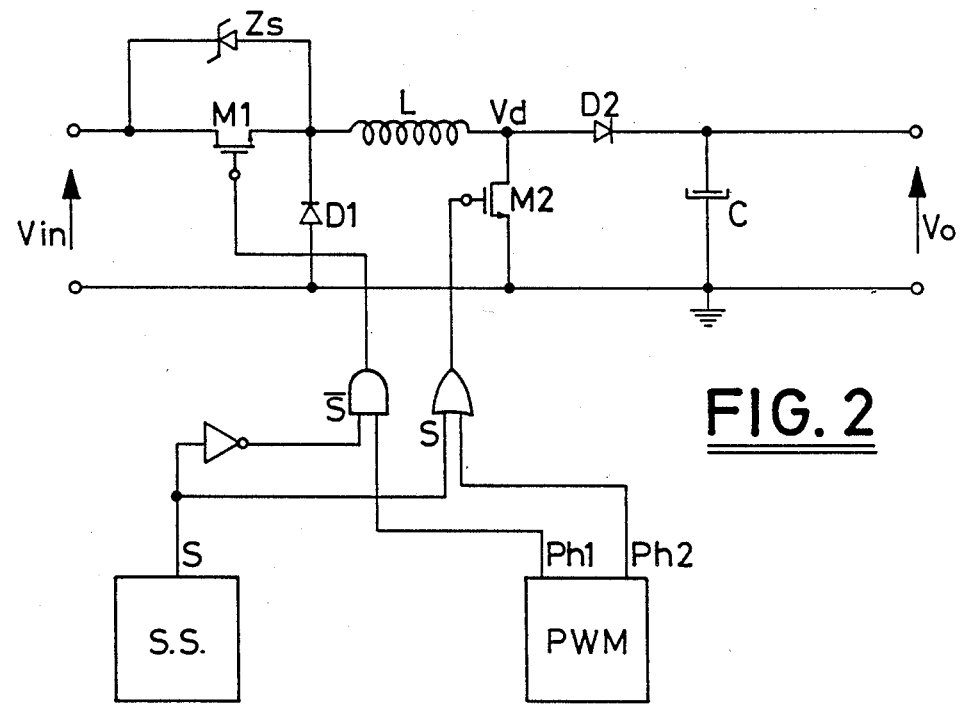
FIG. 2 is the circuit diagram of an embodiment of the circuit arrangement of the present invention for the protection from spikes applied to a FLYBACK converter circuit similar to the circuit of FIG. 1.

With reference to FIG. 2, a protection circuit arrangement of the invention comprises a voltage limiting device Zs, which may be a Zener diode or an avalanche diode or a voltage dependent resistor or a similar integrated structure, connected functionally in parallel across the first analog switch formed by the transistor M1, which is connected between a terminal of the inductance L and the supply rail (Vin).

A spike sensor, schematically shown by the block S.S., generates a logic signal S when sensing a voltage greater than a preset value on the supply line (Vin). The desired switching-off of the transistor M1 and the switching-on of the transistor M2 when a spike is so detected takes place by employing, as shown in FIG. 2, an AND gate for driving the switch (transistor) M1 and applying to the two inputs of the AND gate the driving signal Ph1 (which in the example shown is identical to the other driving signal Ph2) and, respectively, the inverse signal $\overline{S}$ of the logic signal generated by the spike sensor S.S., which is obtained by means of the shown inverter, and an OR gate for driving the second switch (transistor) M2 by applying to the two inputs of the OR gate the second driving signal Ph2 (=Ph1) and the S signal generated by the spike sensor S.S., respectively.

Assuming the occurrence of a spike of 1,000V on the supply line (Vin equal to about 310 VDC) and a voltage limiting element Z's having a breakdown voltage of 500V, upon the switching-off of the transistor M1, forced to an OFF condition by the signal generated by the spike sensor S.S., the voltage limiting element Z's starts to conduct and limits the value of the voltage across the transistor M1 to a value substantially equal to the breakdown voltage of the limiting element (500V). Simultaneously, in accordance with the embodiment shown in FIG. 2, the transistor M2 is forced to conduct by the same signal generated by the spike sensor S.S. and therefore the current in the circuit is limited by the fact that across the inductance L a maximum transient voltage of 500V occurs. This voltage value is relatively little different from the voltage present across the inductance L during the normal operation of the converter circuit when the transistor M1 is conducting (in consideration of the fact that the rectified supply voltage Vin is about equal to 310 VDC). In this way, during the duration of the spike the current flowing through the inductance L is of the same order of magnitude of the current circulating therethrough during the normal operation and therefore also the energy being dissipated in the protecting device Z's, while a portion of the energy associated with the spike is advantageously stored in the inductance L, may be determined.

Figure 3:
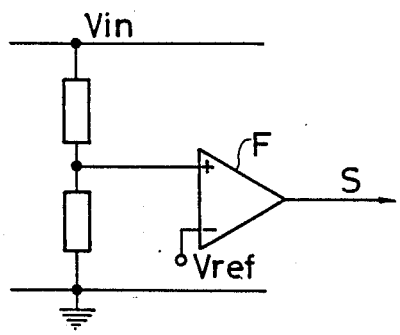
FIG. 3 is a circuit diagram of the block S.S. of FIG. 2.

The spike sensor S.S. may be realized in the manner depicted in FIG. 3, by employing a comparator F, capable of generating a signal S of a logic level when a signal replica of the supply voltage Vin fed to the noninverting input (+) of the comparator becomes greater than a given voltage which may be preset by applying to the inverting input (−) of the comparator a constant reference voltage Vref.

Figure 1:
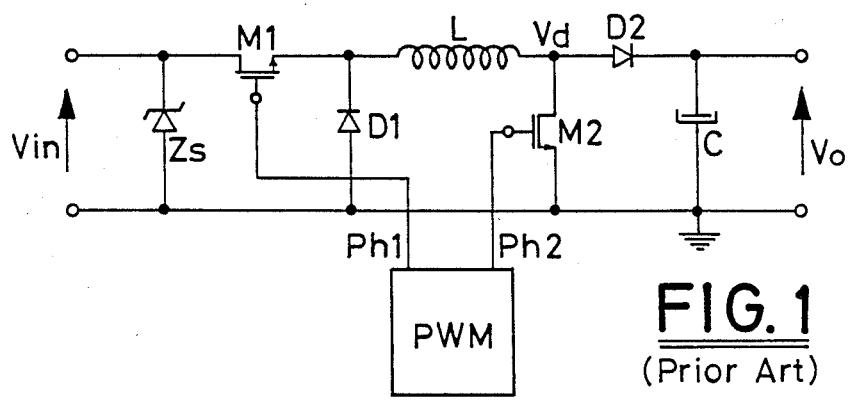
FIG. 1 depicts a typical FLYBACK converter circuit provided with spike suppressing means in accordance with the prior art, as described before.
Figure 4:
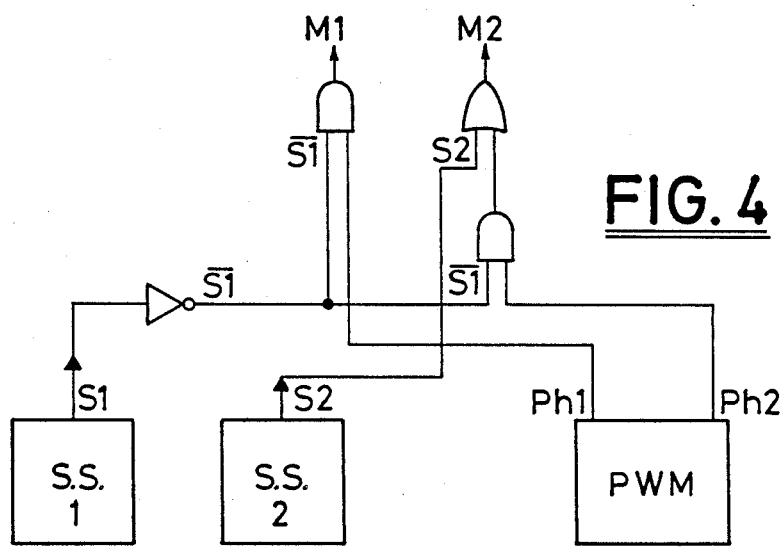
FIG. 4 depicts an alternative configuration of the driving logic means employed in the circuit, in accordance with another embodiment of the invention.
Figure 5:
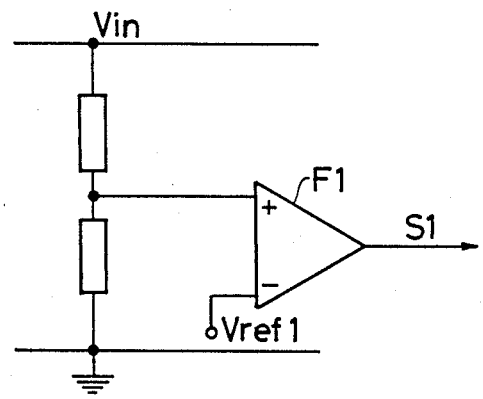
FIG. 5 is a circuit diagram of the block S.S. 1 of FIG. 4.
Figure 6:
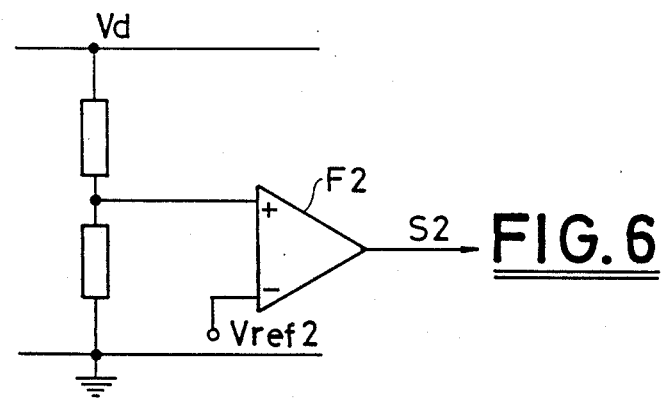
FIG. 6 is a circuit diagram of the block S.S. 2 of FIG. 4.

An alternative embodiment of the invention, which contemplates maintaining in an OFF condition also the transistor M2 in presence of a spike on the supply rail until such a time when the voltage across the transistor M2 reaches preset maximum value, is depicted in FIG. 4. According to this alternative embodiment, two spike sensors are employed, respectively S.S.1 and S.S.2, which may be made as shown in FIGS. 5 and 6, respectively. The spike sensor S.S.1 shown in FIG. 5 may be substantially similar to the spike sensor of FIG. 3. The second spike sensor S.S.2 shown in FIG. 6 may be made by employing a circuit similar to the first spike sensor S.S.1 and using a comparator F2 to the noninverting input of which a signal replica of the voltage Vd present across the transistor M2 of the FLYBACK converter circuit described before and depicted in FIG. 1 and in FIG. 2 is applied.

While the driving logic circuit of the first transistor M1 remains unchanged in respect to the previous embodiment of FIG. 2, the driving logic circuit of the second transistor M2 comprises, as shown in FIG. 4, a first AND gate, to the inputs of which are respectively applied the signals S1 and the driving signal Ph2 (=Ph1), followed by an OR gate, to the inputs of which are respectively fed the output signal of the AND gate and the logic signal S2 generated by the second spike sensor S.S.2.

As it is easily recognized, the logic circuitry driving the transistor M2 is such as to switch-off also the transistor M2 when a spike occurs on the supply line. In this way the maximum voltage across the transistor M1 remains limited to the breakdown voltage of the protecting voltage limiting element Z's, connected across the transistor M1. Simultaneously, the energy of the transient peak is transmitted through the inductance L to the output capacitor C and therefore it becomes available to the load of the converter circuit. The voltage Vd across the transistor M2 gradually increases until its value reaches a maximum value preset by means of the reference voltage Vref2 applied to one input terminal of the comparator F2 of the second spike sensor. When this occurs the transistor M2 is switched-on thus allowing dissipation toward ground of the residual excess energy of the transient peak in order to prevent the breakdown of the transistor M2.

Also in the case of this second embodiment of the invention, a portion of the energy associated with the transient voltage peak is advantageously stored in the reactances represented by the inductance L and by the output capacitance C of the converter and the maximum current flowing through the circuit may be easily determined.

Notwithstanding the fact that the invention has been described in relation to a particular application to a FLYBACK type converter circuit, the protection circuit of the invention is useful also for other similar power circuits, as it will clearly be apparent to a skilled technician.

What we claim is:

1. In a power converter circuit operating in a switching mode and comprising an inductance, a first analog switch connected substantially in series with said inductance between a terminal of the latter and a power distribution rail and a second analog switch connected between the other terminal of the inductance and a common potential node of the circuit and wherein said analog switches are driven respectively by a first and a second driving signals generated by a Pulse Width Modulation control circuit;
 a circuit arrangement for protecting the circuit from voltage spikes occurring on said power distribution rail, comprising:
 a protection voltage limiting device functionally connected across said first analog switch;
 at least a spike sensor capable of generating a logic signal in presence of a voltage spike on the power distribution rail;
 logic means for driving said first and second analog switches capable of opening said first analog switch and closing said second analog switch when said spike sensor generates said logic signal in presence of a voltage spike.

2. A circuit according to claim 1, wherein said logic means for driving said switches comprise at least an AND gate, the output signal of which drives said first analog switch, having two inputs terminals to which are respectively fed said first driving signal and an inverted replica of said logic signal generated by said spike sensor, and at least an OR gate, the output signal of which drives said second analog switch, having two inputs to which are respectively fed said second driving signal and said logic signal generated by said spike sensor.

3. A circuit according to claim 1, wherein said spike sensor is formed by a comparator having two input terminals to which are respectively fed a signal replica of the voltage present on said power distribution rail and a constant reference voltage.

4. A circuit according to claim 1, wherein said protecting voltage limiting device is chosen from the group composed by Zener diodes, avalanche diodes, voltage-dependent resistors and integrated structures having a voltage/current characteristic showing a definite breakdown voltage.

5. In a power converter circuit, operating in a switching mode and comprising an inductance, a first analog switch connected substantially in series with said inductance between a terminal of the latter and a power distribution rail and a second analog switch connected between the other terminal of the inductance and a common potential node of the circuit and wherein said analog switches are driven respectively by a first and a second driving signals generated by a Pulse Width Modulation control circuit;
 a circuit arrangement for protecting the circuit from voltage spikes occurring on said power distribution rail, comprising:
 a protection voltage limiting device functionally connected across said first analog switch;
 a first spike sensor capable of generating a first logic signal when sensing a voltage spike on the power distribution rail;
 a second spike sensor capable of generating a second logic signal in presence of a voltage across said second analog switch greater than a preset voltage;
 logic means for driving said first and second analog switches capable of opening said first and said second analog switches when said first spike sensor generates said logic signal upon sensing a spike on the power rail and said second spike sensor does not detect a voltage across said second analog switch greater than said preset voltage, and of closing said second analog switch when said second spike sensor detects a voltage across said second analog switch greater than said preset voltage and generates said second logic signal.

6. A protection circuit according to claim 5, wherein said logic means for driving said second analog switch comprise an AND gate having two input terminals to which are respectively fed said second driving signal and an inverted replica of said first logic signal generated by said first spike sensor and an OR gate having two inputs terminals to which are respectively fed the output signal of said AND gate and said second logic signal generated by said second spike sensor;
 the output signal of said OR gate driving said second analog switch.

7. A circuit according to claim 5, wherein said first spike sensor is formed by a first comparator to the inputs of which are respectively fed a signal replica of the potential of said power distribution rail and a first reference voltage and said second spike sensor is formed by a second comparator, to the inputs of which are respectively fed a signal replica of the voltage present across said second analog switch and a second reference voltage.

* * * * *